United States Patent [19]
Hanke et al.

[11] Patent Number: 5,973,336
[45] Date of Patent: *Oct. 26, 1999

[54] LED WITH LIGHT EMISSION ON ALL SIDES

[75] Inventors: Christian Hanke, Munich; Bernhard Stegmueller, Augsburg, both of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/963,244

[22] Filed: Nov. 3, 1997

[30] Foreign Application Priority Data

Dec. 17, 1996 [DE] Germany ............... 196 52 528

[51] Int. Cl.$^6$ ................................................. H01L 33/00
[52] U.S. Cl. ................ 257/94; 257/96; 257/97; 257/98; 372/44; 372/45

[58] Field of Search .................. 257/94, 96, 97, 257/98; 372/45, 44

[56] References Cited

U.S. PATENT DOCUMENTS

| | | | |
|---|---|---|---|
| 4,766,470 | 8/1988 | Scholl et al. ............... | 357/17 |
| 4,953,170 | 8/1990 | Logan et al. ............... | 372/44 |
| 5,264,715 | 11/1993 | Guenter et al. ............ | 257/98 |
| 5,331,655 | 7/1994 | Harder et al. .............. | 372/45 |
| 5,537,433 | 7/1996 | Watanabe .................. | 372/45 |
| 5,572,539 | 11/1996 | Kondo ....................... | 372/45 |

FOREIGN PATENT DOCUMENTS 0 635 893 A1  1/1995  European Pat. Off. .

Primary Examiner—William Mintel
Attorney, Agent, or Firm—Hill & Simpson

[57] ABSTRACT

An LED having improved light emission characteristics by allowing radiation generated to be guided towards the side faces of the LED by means of a relatively thick waveguide comprised of a transmissive material, specifically in such a way that as many modes as possible can propagate.

7 Claims, 1 Drawing Sheet

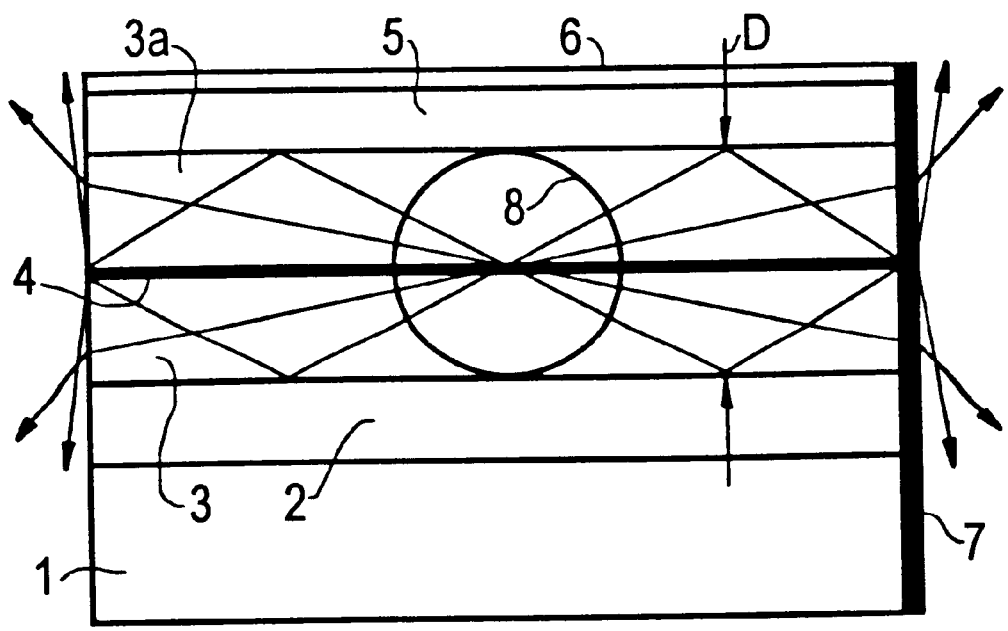

LED WITH LIGHT EMISSION ON ALL SIDES

BACKGROUND OF THE INVENTION

1. Field of the Invention

The present invention relates generally to the field of LED devices and, more particularly, the present invention relates to an LED which emits light from all sides.

2. Description of the Related Art

Surface-emitting and edge-emitting LEDs are generally known in the art. In edge-emitting LEDs, light emerges at the side in the plane of the active zone. U.S. Pat. No. 5,264,715 describes an LED in which the light in a waveguide is guided to the side faces of the component. The reference describes a structure which can be used to prevent the light from propagating in undesired modes in the waveguide. In one embodiment, the thickness of the wave-guiding layer is limited to a little more than 0.8 times the wavelength of the radiation generated in the case of propagation in the material of the wave-guiding layer. The waveguide is guided up to the edge of the component. The active region can likewise reach as far as the edges or be limited to a region in the interior of the wave-guiding layer.

It is an object of the present invention to provide an LED structure in which the light emission is substantially improved by comparison with these conventional LEDs.

SUMMARY OF THE INVENTION

In order to improve the emission of light from the LED, the lateral emission (edge emission) is improved in the LED according to the invention by virtue of the fact that the radiation generated is guided towards the side faces of the LED by means of a relatively thick waveguide. Specifically, this is done in such a way that as many modes as possible can propagate.

The following description based on the attached figure relates principally to an LED structure in an InGaAlAs system of materials which forms a so-called heterolayer structure on a substrate. This may be, for example, a GaAs substrate. The structure according to the invention can be implemented correspondingly in another system of materials such as, for example, InGaAlP/GaAs, InGaAsP/InP or InGaAsP/GaAs.

BRIEF DESCRIPTION OF THE DRAWINGS

FIG. 1 illustrates a first embodiment of the present invention.

DETAILED DESCRIPTION OF THE PREFERRED EMBODIMENTS

FIG. 1 illustrates a layer sequence grown on a substrate 1. First a lower cladding layer 2, then a lower component 3 of a wave-guiding layer and an active layer 4 are provided for generating radiation. An upper component 3a of the wave-guiding layer and an upper cladding layer 5 and a cover layer 6 are formed. The active layer is comprised of a layer component of the overall wave-guiding layer 3, 3a, 4. The active layer is substantially thinner than the wave-guiding layer.

In the GaAs system of materials described here, it is preferred that the substrate is GaAs, and each of the layers grown on the substrate is $In_yGa_{1-y}Al_xAs_{1-x}$. In this case, the x and y values vary in such a way that the refractive index of the cladding layers is substantially lower than the refractive index of the adjacent component of the wave-guiding layer.

In this way, waves are guided in the interior of the wave-guiding layer. The material properties of the system of materials are known. For example, the refractive index increases with decreasing aluminum component. The active zone 4 can be structured as a simple quantum well or as a multiple quantum well (MQW).

The MQW structure is formed by a layer sequence comprised of layers of different energy band gaps. The individual layers are typically 5 nm to 20 nm thick. The wave-guiding layer, within which the active layer is arranged, is made from a material of higher energy band gap (for example AlGaAs), which is transparent to the light generated. A thickness D (dimension perpendicular to the plane of the layer) of at least one, preferably of several wavelengths of the radiation generated is characteristic of this wave-guiding layer 3, 3a, 4.

It is to be borne in mind here that, in accordance with the magnitude of the refractive index, the wavelength of the radiation generated is shorter in the material than in vacuum. Typical dimensions for the thickness D of the wave-guiding layer (overall thickness of the layers 3, 3a, 4 perpendicular to the plane of the layer) are in range from 0.5 $\mu$m to 30 $\mu$m. A thickness of at least 0.5 $\mu$m, or a minimum thickness adapted to the relevant material, results in at least two modes of the radiation generated being able to propagate in the waveguide in the event of a discontinuity, caused by the mutually adjacent materials in the refractive index at the boundary between the wave-guiding layer and the cladding layers.

The number of modes capable of propagation, that is to say the fundamentals of the radiation inside the waveguide, depends on the discontinuity in the refractive index between the materials of the waveguide and the adjacent cladding layers. It is essential for the LED according to the invention that at least two modes of the radiation generated, preferably several modes, are capable of propagating in the waveguide in such a way that the radiation reaches the edges, that is to say the side faces which bound the wave-guiding layer laterally in the plane of the layers.

The cladding layers can be made of semiconductor material, in particular, they can be formed by layer sequences (for example layers with alternating refractive index as in the case of a Bragg reflector), they can consist of a dielectric, or they can be formed by the ambient air. In the latter case, the upper cladding layer 5, for example, is omitted, and the injection of current into the active layer is performed by the upper component 3a, doped in a conducting fashion, of the wave-guiding layer. The layers 5 and 6 illustrated in the figure can also be omitted.

Layers on both sides of the active layer 4 are doped for electric conductivity of opposite sign. It is possible, for example, for the wave-guiding layer 3, 3a, to remain undoped like the active layer, while the upper cladding layer 5 is doped to be p-conducting, and the lower cladding layer 2 is doped to be n-conducting. The connector contacts are then located, for example, on the cover layer 6, likewise doped to be p-conducting, and on the underside of the substrate 1, which is then also doped to be n-conducting. It is desirable for the cover layer 6 to be highly doped for providing a low contact resistance between the metal of the contact and the semiconductor material. If the upper cladding layer 5 and the cover layer 6 are omitted, the upper component 3a of the wave-guiding layer is doped to be p-conducting. The contact is then applied directly on the upper wave-guiding layer. The signs of the doping can also be reversed.

Indicated by the circle 8 in the figure is a zone in which, when current is applied, spontaneous emission of radiation is excited as a consequence of the current injection. This radiation is reflected in the illustrated directions of the arrows under multiple reflection at the interfaces of the wave-guiding layer towards the side faces. The emission takes place, in accordance with the illustrated arrows, laterally in various directions.

In order to improve the emission of radiation, an antireflecting layer 7, which is indicated in the figure only on the right-hand side, can be provided on the side face. This antireflecting layer 7 can also be omitted. The light emission can also be improved by other known measures. The active layer 4 is constructed in such a way that it does not absorb the radiation, or absorbs only very little, with the result that the overall waveguide, including the active layer, has so low an absorption that virtually all the radiation totally reflected in the interior of the waveguide is guided to the side faces. In the LED structure according to the present invention, the emission of radiation is therefore particularly high at the side faces.

As illustrated in the Figure, the active layer 4 can be arranged between two equally thick components 3, 3a of the wave-guiding layer. The diode according to the invention functions particularly effectively with an asymmetric arrangement of the active layer inside the waveguide. One component (3 or 3a) of the wave-guiding layer being at most half as thick, preferably at most one tenth as thick as the other (3a or 3). In the typical exemplary embodiment, the thickness D of the overall wave-guiding layer can be about 6 $\mu$m; the active layer 4 is arranged at a spacing of 100 nm from a cladding layer 2, 5. This spacing of the active layer from a cladding layer can be selected to be as small as desired. The lower component 3 or the upper component 3a of the wave-guiding layer below or above the active layer can be entirely omitted.

It will be recognized by those skilled in the art that the reference to the term "LED" herein is more than simply the light-emitting semiconductor portion but rather this also refers to the accompanying structure as well.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A light-emitting diode comprising:

an active layer;

a wave-guiding layer which is substantially transparent to radiation generated in the active layer formed adjacent the active layer;

at least one cladding layer comprised of a material which has a lower refractive index than a material of the wave-guiding layer located adjacent the wave-guiding layers, wherein a thickness of the wave-guiding layer is at least equal to a wavelength of radiation generated in the active layer, wherein side faces which bound the wave-guiding layer in a plane of the active layer are provided for light emission; and wherein contacts are connected to a region which is spaced apart from the active layer and further wherein the active layer is asymmetrically arranged within the wave-guiding layer, said layer structure comprised of GaAs and wherein a thickness of the waveguide provides for transmission of at least two modes of radiation.

2. The LED according to claim 1, in which the wave-guiding layer is at least 0.5 $\mu$m thick.

3. The LED according to claim 1, in which the active layer is arranged between two wave-guiding layers and wherein one of said wave-guiding layers is at most half as thick as the other.

4. The LED according to claim 1, in which the active layer is located between two wave-guiding layers, and one of said wave-guiding layers is at most a tenth as thick as the other.

5. The LED according to claim 1 or 2, in which the wave-guiding layer is comprised of the active layer and at least one further layer and wherein the active layer is arranged above or below this residual component.

6. The LED according to one of claims 1 to 4, in which the active layer is constructed as a MQW layer sequence.

7. The LED according to claim 1, further comprising a GaAs substrate.

* * * * *